(12) United States Patent
Shimizu et al.

(10) Patent No.: US 12,058,937 B2
(45) Date of Patent: Aug. 6, 2024

(54) THERMOELECTRIC CONVERSION MODULE AND STRUCTURE FOR THERMOELECTRIC CONVERSION ELEMENT

(71) Applicant: TPR Co., Ltd., Tokyo (JP)

(72) Inventors: Toshiaki Shimizu, Tokyo (JP); Shinpei Teshima, Tokyo (JP); Hiromu Kobori, Tokyo (JP); Yasuhiko Okamura, Tokyo (JP); Kazuki Otomo, Tokyo (JP); Naoaki Hidaka, Tokyo (JP)

(73) Assignee: TPR Co., Ltd., Tokyo (JP)

( * ) Notice: Subject to any disclaimer, the term of this patent is extended or adjusted under 35 U.S.C. 154(b) by 0 days.

(21) Appl. No.: 18/215,717

(22) Filed: Jun. 28, 2023

(65) Prior Publication Data

US 2024/0008367 A1     Jan. 4, 2024

(30) Foreign Application Priority Data

Jun. 30, 2022   (JP) ................. 2022-106167

(51) Int. Cl.
*H10N 10/855*  (2023.01)
*H10N 10/17*   (2023.01)
*H10N 10/81*   (2023.01)

(52) U.S. Cl.
CPC .......... *H10N 10/855* (2023.02); *H10N 10/17* (2023.02); *H10N 10/81* (2023.02)

(58) Field of Classification Search
CPC ........ H10N 10/01; H10N 10/17; H10N 10/81; H10N 10/855; H10N 10/856
See application file for complete search history.

(56) References Cited

U.S. PATENT DOCUMENTS

| 2007/0082200 A1* | 4/2007 | Gruen | H10N 10/855 |
| | | | 428/408 |
| 2011/0005564 A1* | 1/2011 | Gruen | H10N 10/855 |
| | | | 977/773 |

FOREIGN PATENT DOCUMENTS

| JP | 2016-207766 A | 12/2016 | |
| JP | 2017-195232 A | 10/2017 | |
| KR | 102087133 B1 * | 3/2020 | ............. H10N 10/17 |

OTHER PUBLICATIONS

JP 2017195232 A online machine translation as provided by FIT database, translated on May 18, 2024.*

* cited by examiner

*Primary Examiner* — Golam Mowla
(74) *Attorney, Agent, or Firm* — MARSHALL, GERSTEIN & BORUN LLP

(57) ABSTRACT

A thermoelectric conversion module includes a base material having heat insulation properties and carbon nanotube yarn that is helically wound around the base material, P-type parts and N-type parts are alternately arranged and are series-connected in an extension direction of the carbon nanotube yarn, one side part of a helix formed by the carbon nanotube yarn is formed as a heat reception part, and the other side part across the base material from the one side part is formed as a heat dissipation part, lengths of the P-type parts and lengths of the N-type parts are shorter than a length of a one-turn portion of the helix, and the P-type parts and the N-type parts are arranged such that respective one end parts are included in the heat reception part and respective other end parts are included in the heat dissipation part.

9 Claims, 7 Drawing Sheets

THERMOELECTRIC CONVERSION MODULE AND STRUCTURE FOR THERMOELECTRIC CONVERSION ELEMENT

CROSS-REFERENCE TO RELATED APPLICATION

This application is based on Japanese Patent Application No. 2022-106167 filed with the Japan Patent Office on Jun. 30, 2022, the entire contents of which are incorporated herein by reference.

TECHNICAL FIELD

The present invention relates to a thermoelectric conversion module and a structure for a thermoelectric conversion element.

BACKGROUND ART

A thermoelectric conversion element or a thermoelectric conversion module that acquires electromotive force due to the Seebeck effect by connecting a P-type semiconductor and an N-type semiconductor and giving a temperature difference to two ends has been widely used. In this connection, a thermoelectric conversion element that is formed in a fibrous shape from carbon nanotubes is known (for example, Patent document 1).

CITATION LIST

Patent Document

[Patent document 1] Japanese Patent Laid-Open No. 2017-195232
[Patent document 2] Japanese Patent Laid-Open No. 2016-207766

SUMMARY OF INVENTION

Technical Problem

To acquire a large amount of power generated in a thermoelectric conversion element, it is preferable to secure a large temperature difference between a heat-receiving side and a heat-dissipating side in the thermoelectric conversion element. On the other hand, high electric conductivity is required as a property that contributes to increase in functionality of a thermoelectric conversion element. Generally, heat conductivity and electric conductivity are positively related to each other. For this reason, increase in electric conductivity of a material for a thermoelectric conversion element causes increase in heat conductivity and makes it difficult to secure a temperature difference needed to acquire a large amount of power generated. This causes the problem of reduction in thermoelectric conversion efficiency (energy conversion efficiency). The present invention has been made in view of the above-described problem, and has as its object to provide a technique capable of enhancing thermoelectric conversion efficiency in a thermoelectric conversion module.

Solution to Problem

To solve the above-described problem, the present invention has adopted the means below. That is, one aspect of the present invention is a thermoelectric conversion module that has a heat reception part and a heat dissipation part, and uses a temperature difference between the heat reception part and the heat dissipation part to generate power. A thermoelectric conversion module according to the present invention includes a base material having heat insulation properties, and carbon nanotube yarn that is formed in a fibrous shape from a carbon nanotube and is helically wound around the base material, the carbon nanotube yarn includes a plurality of P-type parts formed as P-type semiconductors and a plurality of N-type parts formed as N-type semiconductors, the P-type parts and the N-type parts are alternately arranged and are series-connected in an extension direction of the carbon nanotube yarn, one side part of a helix formed by the carbon nanotube yarn is formed as the heat reception part, and the other side part across the base material from the one side part is formed as the heat dissipation part, lengths of the P-type parts and lengths of the N-type parts are shorter than a length of a one-turn portion of the helix, in the extension direction of the carbon nanotube yarn, and the P-type parts and the N-type parts are arranged such that respective one end parts are included in the heat reception part and respective other end parts are included in the heat dissipation part.

The thermoelectric conversion module according to the present invention can secure a temperature difference between the heat reception part and the heat dissipation part, i.e., a temperature difference between the two end parts in each of the P-type parts and the N-type parts by intervention of the base material having heat insulation properties between the heat reception part and the heat dissipation part. As a result, the thermoelectric conversion module according to the present invention can enhance thermoelectric conversion efficiency.

The thermoelectric conversion module according to the present invention may further include an insulating wire having insulation properties, the base material may have insulation properties, and the insulating wire may be helically wound around the base material so as to intervene between adjacent one-turn portions in the helix of the carbon nanotube yarn.

In the thermoelectric conversion module according to the present invention, the carbon nanotube yarn may be formed as zero twist yarn in which a plurality of carbon nanotubes are oriented in one direction and are gathered.

In the thermoelectric conversion module according to the present invention, the carbon nanotube yarn may be formed from a plurality of carbon nanotubes that are oriented in a direction parallel to a direction in which electric current flows through the carbon nanotube yarn and orthogonal to a direction in which heat transfers from the heat reception part to the heat dissipation part.

In the thermoelectric conversion module according to the present invention, the carbon nanotube yarn may be formed as twist yarn in which a plurality of carbon nanotubes in a bundle are twisted at a twist angle of 4° or less.

The present invention can also be identified as a structure for a thermoelectric conversion element that the above-described thermoelectric conversion module includes. That is, the present invention may be a structure for a thermoelectric conversion element that has a heat reception part and a heat dissipation part, and uses a temperature difference between the heat reception part and the heat dissipation part to generate power, including carbon nanotube yarn that is formed in a fibrous shape from a carbon nanotube and is helically wound around a base material having heat insulation properties, wherein the carbon nanotube yarn includes a plurality of P-type parts formed as P-type semiconductors and a plurality of N-type parts formed as N-type semiconductors, the P-type parts and the N-type parts are alternately arranged and are series-connected in an extension direction of the carbon nanotube yarn, one side part of a helix formed by the carbon nanotube yarn is formed as the heat reception part, and the other side part across the base material from the one side part is formed as the heat dissipation part, lengths of the P-type parts and lengths of the N-type parts are shorter than a length of a one-turn portion of the helix, in the extension direction of the carbon nanotube yarn, and the P-type parts and the N-type parts are arranged such that respective one end parts are included in the heat reception part and respective other end parts are included in the heat dissipation part.

Advantageous Effects of Invention

According to the present invention, it is possible to enhance thermoelectric conversion efficiency in a thermoelectric conversion module.

DESCRIPTION OF EMBODIMENTS

An embodiment of the present invention will be described below with reference to the drawings. A configuration described in the embodiment below is not intended to limit the technical scope of the invention only thereto unless otherwise described. Note that the term "insulation properties" in the present specification refers to electric insulation properties unless otherwise described.

Figure 1:
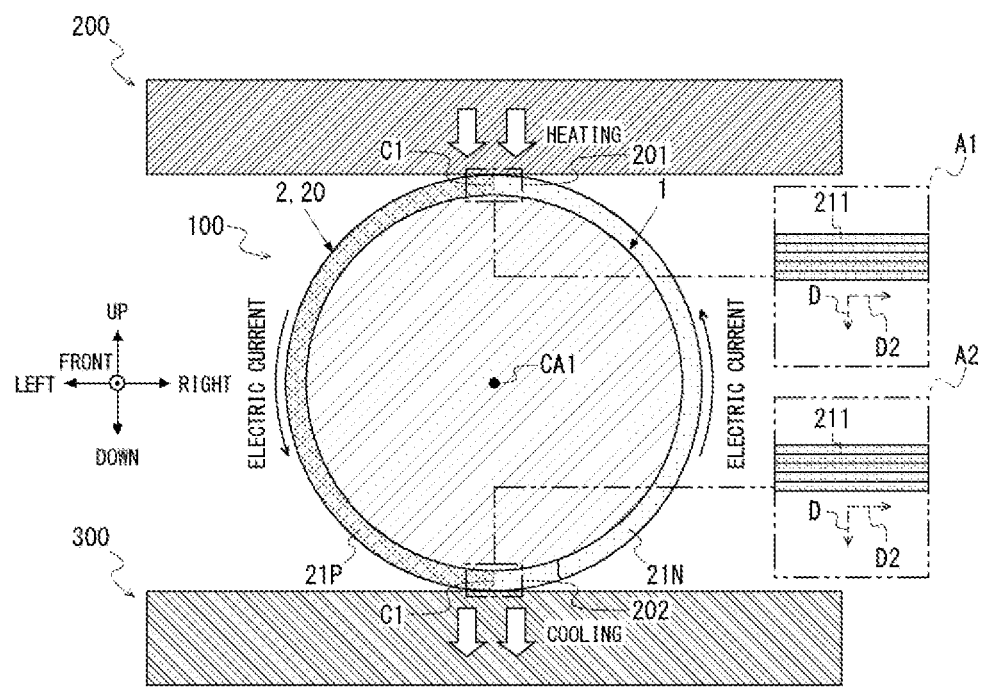
FIG. 1 is a cross-sectional view schematically illustrating a usage state of a thermoelectric conversion module according to an embodiment.
Figure 2:
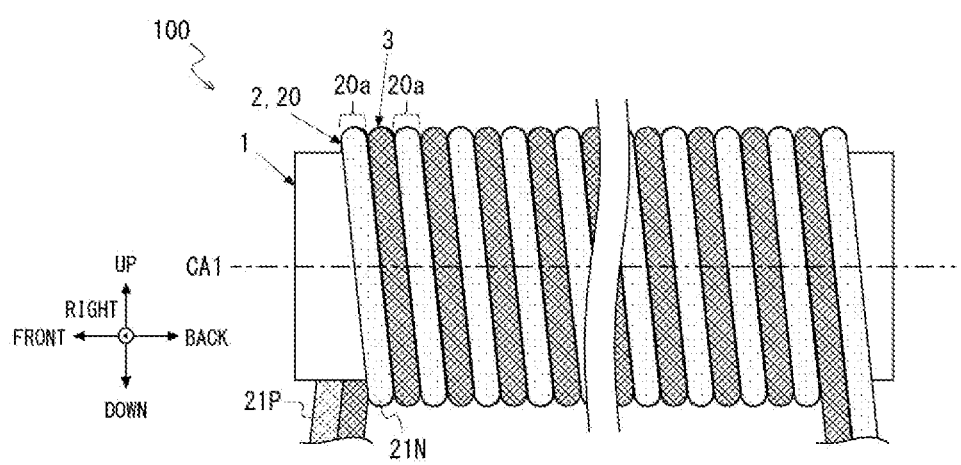
FIG. 2 is a right side view of the thermoelectric conversion module according to the embodiment.
Figure 3:
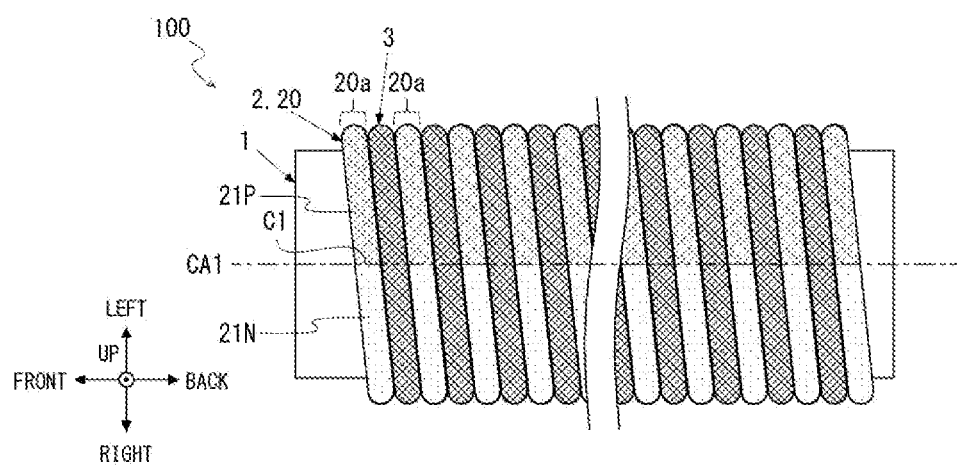
FIG. 3 is a top view of the thermoelectric conversion module according to the embodiment.

FIG. 1 is a cross-sectional view schematically illustrating a usage state of a thermoelectric conversion module 100 according to the embodiment. Arrows illustrated in FIG. 1 represent the front and back, the top and bottom, and the left and right of the thermoelectric conversion module 100. Note that the directions are defined for explanatory convenience and are not intended to limit an orientation of a thermoelectric conversion module according to the present invention. A cross-section orthogonal to a front-back direction is illustrated in FIG. 1. FIG. 2 is a right side view of the thermoelectric conversion module 100 according to the embodiment. FIG. 3 is a top view of the thermoelectric conversion module 100 according to the embodiment.

[Overall Configuration]

As illustrated in FIGS. 1 to 3, the thermoelectric conversion module 100 has an outer shape that is a generally circular column shape extending in the front-back direction. The thermoelectric conversion module 100 is used in a state of being arranged between a hot source 200 and a cold source 300 that are arranged on the top and the bottom. The hot source 200 and the cold source 300 are heat sources for giving a temperature difference to the thermoelectric conversion module 100, and the hot source 200 is at a temperature higher than the cold source 300. The thermoelectric conversion module 100 has a heat reception part 201 that receives heat from the outside and a heat dissipation part 202 that dissipates heat to the outside. The heat reception part 201 is formed at an upper portion of the thermoelectric conversion module 100 so as to come into contact with the hot source 200, and the heat dissipation part 202 is formed at a lower portion of the thermoelectric conversion module 100 so as to come into contact with the cold source 300. The heat reception part 201 receives heat from the hot source 200, and the heat dissipation part 202 dissipates heat to the cold source 300, thereby making a temperature difference between the heat reception part 201 and the heat dissipation part 202. Although the details will be described later, the thermoelectric conversion module 100 generates power by using a temperature difference between the heat reception part 201 and the heat dissipation part 202.

As illustrated in FIGS. 1 to 3, the thermoelectric conversion module 100 includes a base material 1, carbon nanotube yarn 2, and an insulating wire 3. Components of the thermoelectric conversion module 100 will be described below.

[Base Material 1]

The base material 1 is formed in a circular column shape that extends in the front-back direction and is generally circular in cross-section. The base material 1 has heat insulation properties and insulation properties. For example, a material low in heat conductivity and electric conductivity can be used for the base material 1. Although a resin material, such as rubber or urethane, and a ceramic material are given as examples of a material for the base material 1, the material is not limited to these. The base material 1 according to the present example is formed of rubber and has flexibility. Note that the base material 1 need not be entirely made of a material having heat insulation properties and insulation properties. For example, the base material 1 may be formed by coating a surface of a core material with the above-described material having heat insulation properties and insulation properties. In this case, a configuration including the core material and the coating material corresponds to the "base material 1". A shape of and a material for a base material according to the present invention are not limited to the above-described ones.

[Carbon Nanotube Yarn]

Figure 4:
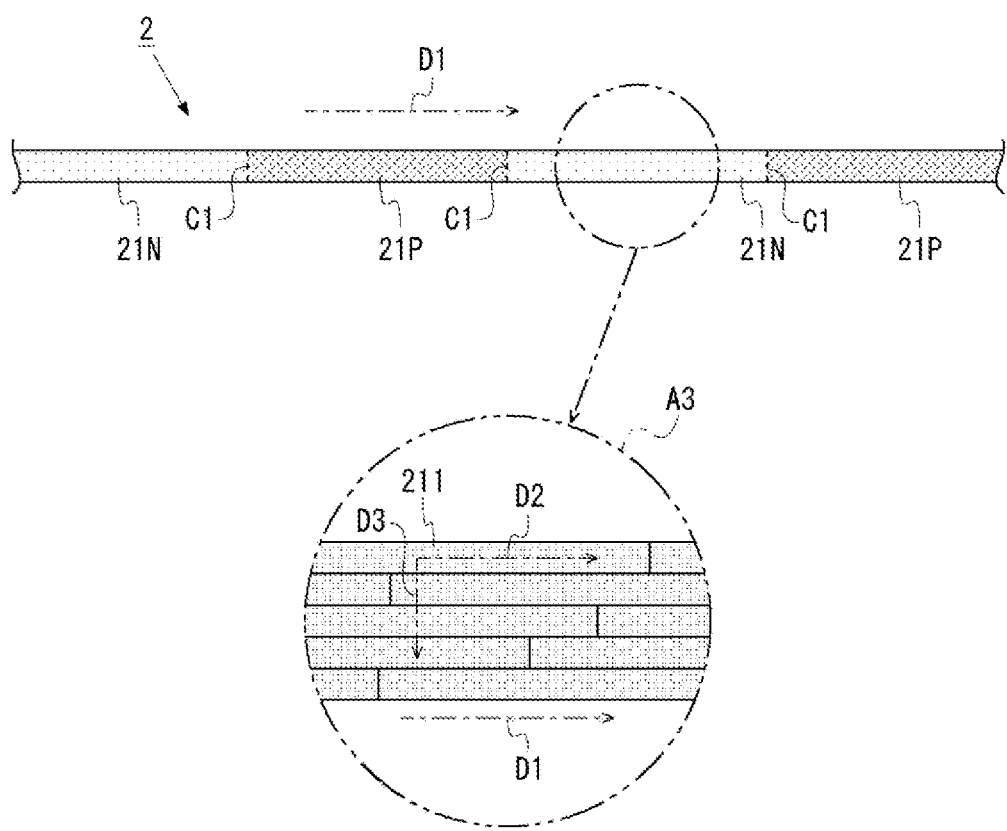
FIG. 4 is a view for explaining a configuration of carbon nanotube yarn according to the embodiment.

The carbon nanotube yarn 2 is a wire having flexibility and conductivity that is predominantly composed of carbon nanotubes and is formed in a fibrous shape. FIG. 4 is a view for explaining a configuration of the carbon nanotube yarn 2 according to the embodiment. As illustrated in an enlarged view A3 in FIG. 4, the carbon nanotube yarn 2 includes a plurality of fibrous carbon nanotubes (also referred to as CNTs) 211, and the plurality of fibrous carbon nanotubes 211 are bound by intermolecular attractive force to be formed into the shape of one fiber. Note that the carbon nanotubes constituting the carbon nanotube yarn 2 may be multiwalled carbon nanotubes (MW carbon nanotubes), single-walled carbon nanotubes (SW carbon nanotubes), or a composite material obtained by mixing these. The carbon nanotube yarn 2 may be graphitized. The carbon nanotube yarn 2 is graphitized by energizing and heating the carbon nanotube yarn 2 put in a graphitizing furnace together with coke breeze. An electric resistance of the carbon nanotube yarn 2 can be reduced by graphitizing the carbon nanotube yarn 2. Note that both end parts of the carbon nanotube yarn 2 are electrically connected via an external load (not illustrated). Electric current flows along an extension direction (length direction) D1 of the carbon nanotube yarn 2. That is, a direction in which electric current flows through the carbon nanotube yarn 2 is the extension direction D1.

In the carbon nanotube yarn 2, the plurality of carbon nanotubes 211 are oriented in a predetermined direction, thereby forming an electron transfer pathway (i.e., a pathway through which electric current flows). As illustrated in the enlarged view A3 in FIG. 4, in the carbon nanotube yarn 2 according to the present example, the plurality of carbon nanotubes 211 are bundled without being twisted and are oriented in the extension direction D1. Particularly, as illustrated in the enlarged view A3 in FIG. 4, an orientation direction D2 of the plurality of carbon nanotubes 211 and the extension direction D1 of the carbon nanotube yarn 2 are parallel. That is, the carbon nanotube yarn 2 according to the present example is formed as zero twist yarn in which the plurality of carbon nanotubes 211 are oriented in one direction and are gathered. Since the plurality of carbon nanotubes 211 are oriented in one direction, an electric resistance can be made lower than in a case where the plurality of carbon nanotubes 211 are not oriented in one direction. Note that the present invention is not limited to this and that carbon nanotube yarn may be formed as twist yarn as in a second modification (to be described later).

The carbon nanotube yarn 2 is configured such that P-type properties and N-type properties appear alternately in the extension direction D1. Specifically, as illustrated in FIG. 4, the carbon nanotube yarn 2 includes a plurality of P-type parts 21P formed as P-type semiconductors and a plurality of N-type parts 21N formed as N-type semiconductors, and the P-type parts 21P and the N-type parts 21N are alternately arranged and are series-connected in the extension direction D1. The P-type parts 21P and the N-type parts 21N are formed over a predetermined range in the extension direction D1 of the carbon nanotube yarn 2 by implanting dopant into the carbon nanotubes 211 constituting the carbon nanotube yarn 2. Note that since a carbon nanotube inherently has a property of a P-type semiconductor, doping for the P-type parts 21P is not essential. In the carbon nanotube yarn 2 according to the present example, a length of each P-type part 21P and a length of each N-type part 21N are equivalent in the extension direction D1 of the carbon nanotube yarn 2. Note that the present invention is not limited to this and that a P-type part and an N-type part may be different in length.

Reference character C1 in FIG. 4 denotes a connection portion of an end part of the P-type part 21P and an end part of the N-type part 21N. Since the P-type part 21P and the N-type part 21N are directly connected (joined to form a PN junction) in the present example, the P-type part 21P and the N-type part 21N are adjacent to each other in the extension direction of the carbon nanotube yarn 2, and the connection portion C1 is formed as a boundary portion where switching between the P-type part 21P and the N-type part 21N occurs. Note that the P-type part 21P and the N-type part 21N may be connected via a different conductor and that the different conductor constitutes the connection portion C1 in this case.

Figure 5:
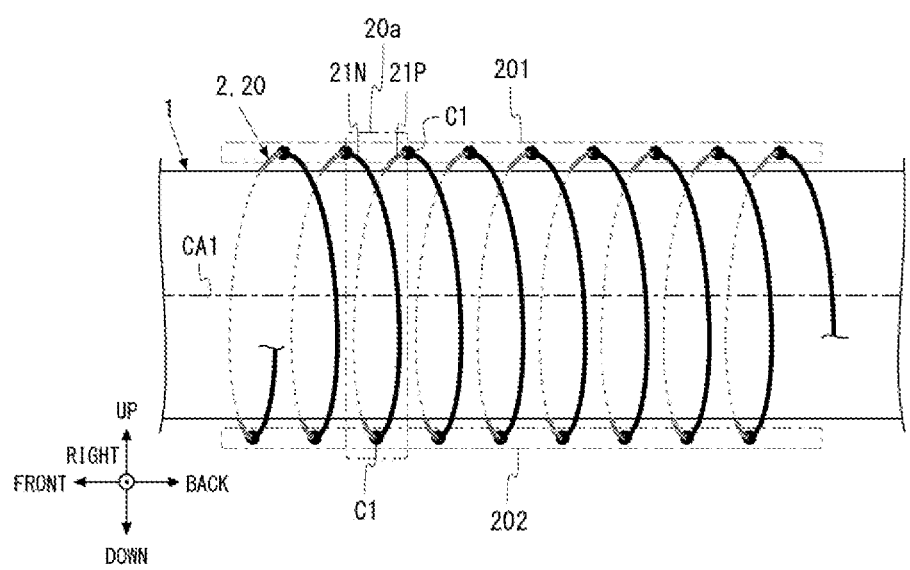
FIG. 5 is a schematic view for explaining a relationship between a base material and the carbon nanotube yarn in the thermoelectric conversion module according to the embodiment.

FIG. 5 is a schematic view for explaining a relationship between the base material 1 and the carbon nanotube yarn 2 in the thermoelectric conversion module 100 according to the embodiment. As illustrated in FIG. 5, the carbon nanotube yarn 2 is helically wound around the base material 1. More specifically, the carbon nanotube yarn 2 is helically wound on a side surface of the base material 1. A helix 20 that surrounds the base material 1 is formed by the helically wound carbon nanotube yarn 2. A central axis of the helix denoted by reference character CA1 extends along a direction (the front-back direction in the present example) in which the base material 1 extends. Hereinafter, a direction in which the central axis CA1 extends may also be referred to as an axis direction. A part corresponding to one turn of the helix 20 that is denoted by reference character 20a in FIG. 5 is referred to as a one-turn portion. In this case, as illustrated in FIG. 5, the P-type parts 21P and the N-type parts 21N as half turns (each of which is a half of the one-turn portion 20a) are alternately arranged in the helix 20. That is, the lengths of the P-type parts 21P and the lengths of the N-type parts 21N are each a length of a half turn of the helix 20 in the extension direction of the carbon nanotube yarn 2. For this reason, the helix 20 is configured such that one P-type part 21P and one N-type part 21N are included in each one-turn portion 20a. In other words, the one-turn portion 20a of the helix 20 is formed from one P-type part 21P and one N-type part 21N. Note that lengths of a P-type part and an N-type part need not correspond to a half turn of a helix in the present invention. In the present invention, the length of the P-type part and the length of the N-type part in an extension direction of a carbon nanotube yarn only need to be shorter than a length of a one-turn portion of a helix in the extension direction.

As illustrated in FIG. 5, a region of a left half of the helix 20 is formed by the P-type parts 21P, and a region of a right half of the helix 20 is formed by the N-type parts 21N. For this reason, each of a plurality of connection portions C1 is arranged at either an upper portion or a lower portion of the helix 20. More particularly, one of two connection portions C1 adjacent in the axial direction (the front-back direction in the present example) of the helix 20 is arranged at the upper part of the helix 20, and the other is arranged at the lower part of the helix 20. As described above, the connection portions C1 are alternately arranged on the top and the bottom. With this configuration, the upper part of the helix 20 is formed as the heat reception part 201, and the lower part of the helix 20 is formed as the heat dissipation part 202. As illustrated in FIG. 5, the heat reception part 201 and the heat dissipation part 202 are formed as regions including a plurality of connection portions C1 lined up in the axial direction on opposite sides (an upper side and a lower side of the base material 1 in the present example) of the base material 1 from each other.

Each of the plurality of connection portions C1 included in the carbon nanotube yarn 2 is arranged at either the heat reception part 201 or the heat dissipation part 202. For this reason, as illustrated in FIG. 5, one end part of each of the plurality of P-type parts 21P is included in the heat reception part 201, and the other end part is included in the heat dissipation part 202. Similarly, one end part of each of the plurality of N-type parts 21N is included in the heat reception part 201, and the other end part is included in the heat dissipation part 202. As illustrated in FIG. 1, the heat reception part 201 is in contact with the hot source 200 arranged above the thermoelectric conversion module 100, and the heat dissipation part 202 is in contact with the cold source 300 arranged below the thermoelectric conversion module 100.

Doping for giving a semiconductor property to the carbon nanotube yarn 2 is performed in a state where a carbon nanotube wire is helically wound on the base material 1. In the doping, a left half is immersed in a solution containing a P-type doping agent in a state where the carbon nanotube wire is wound on the base material 1, and a right half is immersed in a solution containing an N-type doping agent. With this operation, the helix 20, in which the P-type parts 21P and the N-type parts 21N as half turns are alternately arranged on the left and the right, can be obtained. Note that the doping may be performed by various methods, such as vapor deposition, sputtering, and printing.

[Insulating Wire]

The insulating wire 3 is a wire having insulation properties and is wound on the side surface of the base material 1 together with the carbon nanotube yarn 2, as illustrated in FIGS. 2 and 3. Although a synthetic fiber having insulation properties, such as nylon, is given as an example of a material for the insulating wire 3, the material is not limited to this. The insulating wire 3 is helically wound around the base material 1 so as to intervene between adjacent one-turn portions 20a and 20a in the helix 20 of the carbon nanotube yarn 2. In this manner, a double helical structure in which the carbon nanotube yarn 2 and the insulating wire 3 are alternately arranged along the axial direction of the helix 20 is formed in the thermoelectric conversion module 100.

[Power Generation by Thermoelectric Conversion Module]

Power generation by the thermoelectric conversion module 100 will be described below with reference to FIG. 1. As illustrated in FIG. 1, the thermoelectric conversion module 100 is used in a state of being arranged between the hot source 200 and the cold source 300 arranged on the top and the bottom. Since the heat reception part 201 of the thermoelectric conversion module 100 is in contact with the hot source 200, the heat reception part 201 is heated by receiving heat from the hot source 200. In contrast, since the heat dissipation part 202 of the thermoelectric conversion module 100 is in contact with the cold source 300, the heat dissipation part 202 is cooled by dissipating heat to the cold source 300. With this configuration, the heat reception part 201 becomes higher in temperature than the heat dissipation part 202, and a temperature difference is generated between the heat reception part 201 and the heat dissipation part 202. As described above, the P-type parts 21P and the N-type parts 21N constituting the carbon nanotube yarn 2 are arranged such that respective one end parts are included in the heat reception part 201 and respective other end parts are included in the heat dissipation part 202. For this reason, the heat reception part 201 becomes higher in temperature than the heat dissipation part 202, which makes one end part (an end part included in the heat reception part 201) of the P-type part 21P higher in temperature than the other end part (an end part included in the heat dissipation part 202) and generates a temperature difference between the two end parts of the P-type part 21P. As a result, in the P-type part 21P, positive charge transport from the heat reception part 201 side toward the heat dissipation part 202 side occurs, the heat dissipation part 202 side is positively charged, and the heat reception part 201 side is negatively charged. Similarly, one end part (an end part included in the heat reception part 201) of the N-type part 21N becomes higher in temperature than the other end part (an end part included in the heat dissipation part 202), and a temperature difference also occurs between the two end parts of the N-type part 21N. As a result, in the N-type part 21N, negative charge transport from the heat reception part 201 side toward the heat dissipation part 202 side occurs, the heat dissipation part 202 side is negatively charged, and the heat reception part 201 side is positively charged. In this manner, thermal electromotive force due to the Seebeck effect is generated in the P-type part 21P and the N-type part 21N. Connection of an external load to two ends of the carbon nanotube yarn 2 passes electric current through the carbon nanotube yarn 2, and power can be drawn. As illustrated in FIG. 1, electric current flows from the heat reception part 201 side to the heat dissipation part 202 side in the P-type part 21P, and electric current flows from the heat dissipation part 202 side to the heat reception part 201 side in the N-type part 21N.

In the above-described case, as illustrated in FIG. 1, in the thermoelectric conversion module 100, one side part (the upper portion) of the helix 20 formed by the carbon nanotube yarn 2 is formed as the heat reception part 201, and the other side part (the lower portion) across the base material 1 from the heat reception part 201 is formed as the heat dissipation part 202. That is, the heat reception part 201 and the heat dissipation part 202 are formed on opposite sides (the upper side and the lower side) of the base material 1 having heat insulation properties from each other. Intervention of the base material 1 having heat insulation properties between the heat reception part 201 and the heat dissipation part 202 inhibits heat transfer from the heat reception part 201 to the heat dissipation part 202. This secures a temperature difference between the heat reception part 201 and the heat dissipation part 202, i.e., a temperature difference between two end parts in each of the P-type part 21P and the N-type part 21N and enhances thermoelectric conversion efficiency.

Since the base material 1 has insulation properties as described above, the P-type part 21P and the N-type part 21N included in the carbon nanotube yarn 2 are prevented from being electrically connected via the base material 1. Additionally, since the insulating wire 3 having insulation properties intervenes between adjacent one-turn portions 20a and 20a in the helix 20, the P-type part 21P and the N-type part 21N are prevented from being electrically connected at a point other than the connection portion Cl. This maintains a state where the P-type part 21P and the N-type part 21N are electrically series-connected.

As described above, the carbon nanotube yarn 2 according to the present example is formed as zero twist yarn in which the plurality of carbon nanotubes 211 are bundled without being twisted, and the orientation direction D2 of the plurality of carbon nanotubes 211 is parallel to the extension direction D1 of the carbon nanotube yarn 2 that is a direction in which electric current flows. This allows enhancement of electric conductivity of the thermoelectric conversion module 100. When heat transfer in the orientation direction D2 is compared with heat transfer in a direction (a direction denoted by reference character D3 in the enlarged view A3 in FIG. 4) orthogonal to the orientation direction D2 in the carbon nanotube yarn 2, heat tends not to be transferred in the direction D3 orthogonal to the orientation direction D2.

Assume here that a direction (a downward direction in the present example) from the heat reception part 201 toward the heat dissipation part 202 is a first direction D in FIG. 1. The first direction D is a heat transfer direction in a case where heat transfers from the heat reception part 201 to the heat dissipation part 202 in the shortest distance. In this case, as illustrated in an enlarged view A1 of the heat reception part 201 in FIG. 1, the orientation direction D2 and the first direction D are orthogonal in the heat reception part 201. Similarly, as illustrated in an enlarged view A2 of the heat dissipation part 202 in FIG. 1, the orientation direction D2 and the first direction D are also orthogonal in the heat dissipation part 202. This is because the carbon nanotube yarn 2 is formed as zero twist yarn. Since the orientation direction D2 and the first direction D are orthogonal in the heat reception part 201 and the heat dissipation part 202, heat transfer from the heat reception part 201 to the heat dissipation part 202 is further inhibited. This more suitably secures a temperature difference between the heat reception part 201 and the heat dissipation part 202.

[Operation and Effect]

As has been described above, the thermoelectric conversion module 100 according to the present embodiment includes the base material 1 having heat insulation properties and the carbon nanotube yarn 2 that is formed in a fibrous shape from the carbon nanotubes 211 and is helically wound around the base material 1. The carbon nanotube yarn 2 includes the plurality of P-type parts 21P formed as P-type semiconductors and the plurality of N-type parts 21N formed as N-type semiconductors, and the P-type parts 21P and the N-type parts 21N are alternately arranged and are series-connected in the extension direction of the carbon nanotube yarn 2. The one side part of the helix 20 formed by the carbon nanotube yarn 2 is formed as the heat reception part 201, and the other side part across the base material 1 from the one side part is formed as the heat dissipation part 202. The lengths of the P-type parts 21P and the lengths of the N-type parts 21N are shorter than a length of the one-turn portion 20a of the helix 20 in the extension direction of the carbon nanotube yarn 2. The P-type parts 21P and the N-type parts 21N are arranged such that respective one end parts are included in the heat reception part 201 and respective other end parts are included in the heat dissipation part 202.

The above-described thermoelectric conversion module 100 can secure a temperature difference between the heat reception part 201 and the heat dissipation part 202, i.e., a temperature difference between the two end parts in each of the P-type part 21P and the N-type part 21N by intervention of the base material 1 having heat insulation properties between the heat reception part 201 and the heat dissipation part 202. As a result, the thermoelectric conversion module 100 according to the present embodiment can enhance the thermoelectric conversion efficiency. Even if heat conductivity of the carbon nanotube yarn 2 is enhanced by enhancing electric conductivity of the carbon nanotube yarn 2, the thermoelectric conversion module 100 can secure a temperature difference between the heat reception part 201 and the heat dissipation part 202 because of heat insulation properties of the base material 1. For this reason, the thermoelectric conversion module 100 can secure a temperature difference between the heat reception part 201 and the heat dissipation part 202 while enhancing the electric conductivity of the carbon nanotube yarn 2. This allows acquisition of higher thermoelectric conversion efficiency. That is, the thermoelectric conversion module 100 is capable of achieving both high electric conductivity and enhancement of the thermoelectric conversion efficiency. The present invention can contribute to Goal 7 "AFFORDABLE AND CLEAN ENERGY," Goal 9 "INDUSTRY, INNOVATION AND INFRASTRUCTURE," and Goal 12 "RESPONSIBLE CONSUMPTION AND PRODUCTION" of the 17 goals of the SDGs (Sustainable Development Goals) led by the United Nations.

Since the thermoelectric conversion module 100 adopts a structure in which the carbon nanotube yarn 2 is wound on the base material 1, the number of series connections between the P-type parts 21P and the N-type parts 21N can be easily increased just by increasing the number of turns of the carbon nanotube yarn 2. It is thus possible to acquire a large electric current with a compact module. Use of a material having flexibility, such as rubber, for the base material 1 allows flexible deformation of the thermoelectric conversion module 100. It is thus possible to enhance convenience of the thermoelectric conversion module 100.

If a belt-like carbon nanotube nonwoven fabric is used instead of the threadlike carbon nanotube yarn 2, a width of one turn is larger, and the number of turns cannot be increased. A large electric current may not be acquired. Additionally, carbon nanotubes are not oriented in the carbon nanotube nonwoven fabric, and electric resistance tends to increase. However, if a film thickness or a width of the carbon nanotube nonwoven fabric is increased to acquire a large electric current, the carbon nanotube nonwoven fabric has the disadvantage of reduction in flexibility (twistability) and stretchability. In contrast, since the threadlike carbon nanotube yarn 2 is used in the thermoelectric conversion module 100, the number of turns can be increased, and a large electric current can be acquired. The carbon nanotube yarn 2 also has the advantage in that the carbon nanotube yarn 2 is superior in flexibility and stretchability to the carbon nanotube nonwoven fabric.

Further, the thermoelectric conversion module 100 according to the present embodiment further includes the insulating wire 3 having insulation properties, the base material 1 has insulation properties, and the insulating wire 3 is helically wound around the base material 1 so as to intervene between adjacent one-turn portions 20a and 20a in the helix 20 of the carbon nanotube yarn 2. This allows maintenance of a state where the P-type part 21P and the N-type part 21N are electrically series-connected and acquisition of a high voltage.

Note that it is not essential for the present invention that a thermoelectric conversion module include an insulating wire and that a base material have insulation properties. For example, if a state where a P-type part and an N-type part are electrically series-connected is maintained by, e.g., coating carbon nanotube yarn with an insulating material, a thermoelectric conversion module need not include an insulating wire, and a base material need not have insulation properties.

The carbon nanotube yarn 2 of the thermoelectric conversion module 100 according to the present embodiment is formed as zero twist yarn in which the plurality of carbon nanotubes 211 are oriented in one direction and are gathered. With this configuration, use of zero twist yarn in which the plurality of carbon nanotubes 211 are oriented in the extension direction D1 of the carbon nanotube yarn 2 as the carbon nanotube yarn 2 allows enhancement of the electric conductivity of the carbon nanotube yarn 2. Since the first direction D that is a direction from the heat reception part 201 toward the heat dissipation part 202 is orthogonal to the orientation direction D2 of the carbon nanotubes 211 in the heat reception part 201 and the heat dissipation part 202 due to use of zero twist yarn as the carbon nanotube yarn 2, a temperature difference between the heat reception part 201 and the heat dissipation part 202 can be more suitably secured. Note that a carbon nanotube yarn according to the present invention need not be one in which a plurality of carbon nanotubes are oriented in one direction and need not be zero twist yarn.

A structure in which carbon nanotube yarn is wound on a base material as in the above-described thermoelectric conversion module 100 is referred to as a "structure for a thermoelectric conversion element" here. The structure for a thermoelectric conversion element may use an existing member as a base material on which carbon nanotube yarn is to be wound. Although, for example, an outer layer in a tubular furnace body used for a high-temperature furnace or the like is formed of an adiabatic material, such a furnace body may be used as the base material. The base material used for the structure for a thermoelectric conversion element need not be a finite object. Since air has heat insulation properties, a structure for a thermoelectric conversion element may use air as a base material.

[First Modification]

Figure 6:
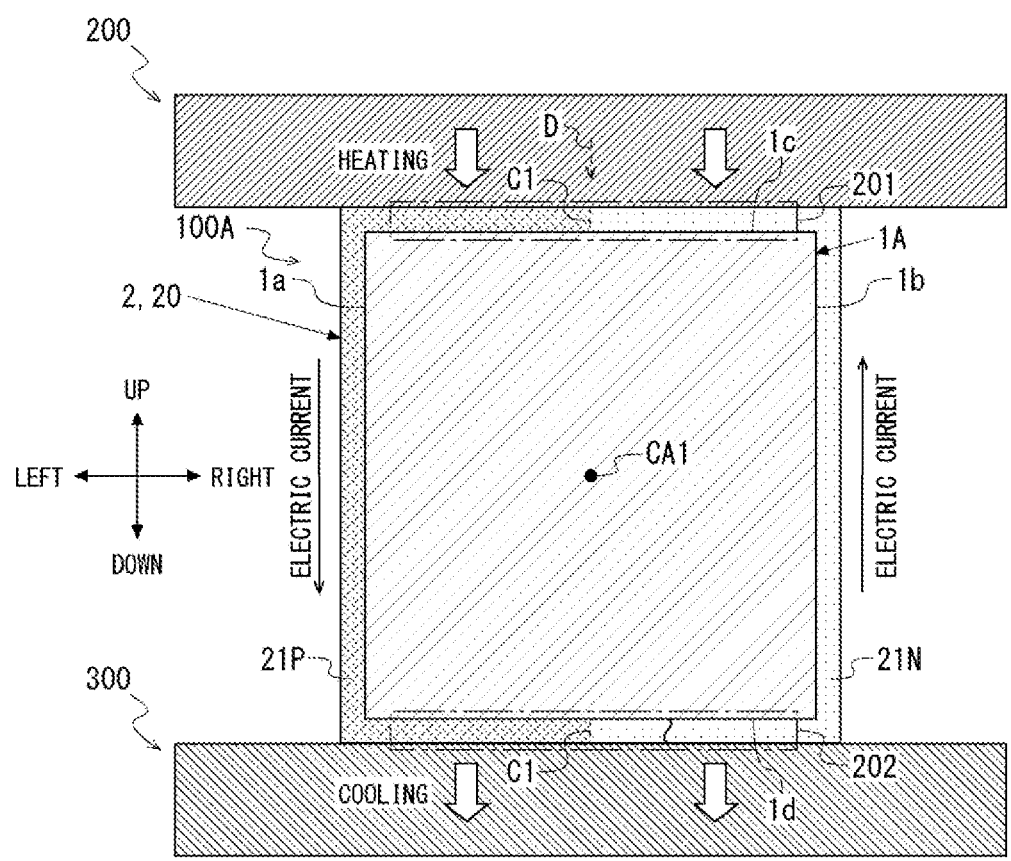
FIG. 6 is a cross-sectional view schematically illustrating a usage state of a thermoelectric conversion module according to a first modification of the embodiment.

FIG. 6 is a cross-sectional view schematically illustrating a usage state of a thermoelectric conversion module 100A according to a first modification of the embodiment. A cross-section orthogonal to a front-back direction is illustrated in FIG. 6. The thermoelectric conversion module 100A according to the first modification is mainly different from the thermoelectric conversion module 100 described with reference to FIG. 1 and the like in that a base material 1A is formed in a prismatic shape that is generally rectangular in cross-section and is roughly the same as the thermoelectric conversion module 100 on the other points. The base material 1A according to the first modification has a rectangular cross-sectional shape including one pair of facing long sides 1a and 1b and one pair of facing short sides 1c and 1d. The base material 1A is arranged such that the long sides 1a and 1b are parallel to an up-down direction. That is, the cross-sectional shape of the base material 1A is a rectangular shape longer in a direction (a first direction D) from the heat reception part 201 toward the heat dissipation part 202. In the base material 1A, the short side 1c is in contact with the hot source 200, and the short side 1d is in contact with the cold source 300.

As illustrated in FIG. 6, in the thermoelectric conversion module 100A as well, the heat reception part 201 and the heat dissipation part 202 are formed on opposite sides (an upper side and a lower side) of the base material 1A having heat insulation properties from each other, and the P-type parts 21P and the N-type parts 21N are arranged such that respective one end parts are included in the heat reception part 201 and respective other end parts are included in the heat dissipation part 202.

In the above-described thermoelectric conversion module 100A as well, the same effects as the thermoelectric conversion module 100 can be achieved. That is, a temperature difference between the heat reception part 201 and the heat dissipation part 202, i.e., a temperature difference between the two end parts in each of the P-type part 21P and the N-type part 21N can be secured by intervention of the base material 1A having heat insulation properties between the heat reception part 201 and the heat dissipation part 202. This allows enhancement of thermoelectric conversion efficiency. The adiabatic effect can be enhanced by using a rectangular shape longer in the direction (the first direction D) from the heat reception part 201 toward the heat dissipation part 202 as the cross-sectional shape of the base material 1A. Note that a cross-sectional shape of a base material according to the present invention may be a square shape.

[Second Modification]

Figure 7:
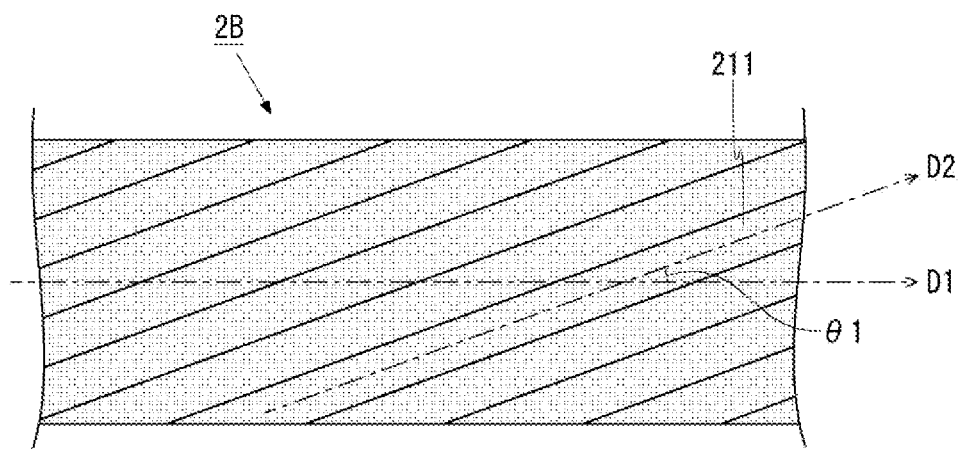
FIG. 7 is an enlarged view of a part of carbon nanotube yarn according to a second modification of the embodiment.

FIG. 7 is an enlarged view of a part of carbon nanotube yarn 2B according to a second modification of the embodiment. As illustrated in FIG. 7, the carbon nanotube yarn 2B according to the second modification is formed as twist yarn in which a plurality of carbon nanotubes 211 in a bundle are twisted. Although the plurality of carbon nanotubes 211 are oriented in one direction, the plurality of carbon nanotubes 211 are not parallel to an extension direction D1 of the carbon nanotube yarn 2B. Assume here that an angle that the extension direction D1 of the carbon nanotube yarn 2B forms with an orientation direction D2 of the carbon nanotube 211 in the carbon nanotube yarn 2B is a twist angle θ1, as illustrated in FIG. 7. In this case, in the second modification, θ1≤4°. With this configuration, a temperature difference between the heat reception part 201 and the heat dissipation part 202 can be suitably secured. Note that it is more preferable that θ1≤3° in terms of securing a temperature difference and that it is still more preferable that θ1≤2°.

<Others>

Although the preferred embodiment of the present invention has been described above, the above-described various forms can be combined to the extent possible.

What is claimed is:

1. A thermoelectric conversion module that has a heat reception part and a heat dissipation part, and uses a temperature difference between the heat reception part and the heat dissipation part to generate power, comprising:
    a base material having heat insulation properties; and
    carbon nanotube yarn that is formed in a fibrous shape from a carbon nanotube and is helically wound around the base material,
    wherein the carbon nanotube yarn includes a plurality of P-type parts formed as P-type semiconductors and a plurality of N-type parts formed as N-type semiconductors,
    the P-type parts and the N-type parts are alternately arranged and are series-connected in an extension direction of the carbon nanotube yarn,
    one side part of a helix formed by the carbon nanotube yarn is formed as the heat reception part, and the other side part across the base material from the one side part is formed as the heat dissipation part,
    lengths of the P-type parts and lengths of the N-type parts are shorter than a length of a one-turn portion of the helix, in the extension direction of the carbon nanotube yarn, and
    the P-type parts and the N-type parts are arranged such that respective one end parts are included in the heat reception part and respective other end parts are included in the heat dissipation part.

2. The thermoelectric conversion module according to claim 1, further comprising
    an insulating wire having insulation properties,
    wherein the base material has insulation properties, and
    the insulating wire is helically wound around the base material so as to intervene between adjacent one-turn portions in the helix of the carbon nanotube yarn.

3. The thermoelectric conversion module according to claim 1,
    wherein the carbon nanotube yarn is formed as zero twist yarn in which a plurality of carbon nanotubes are oriented in one direction and are gathered.

4. The thermoelectric conversion module according to claim 1,
    wherein the carbon nanotube yarn is formed from a plurality of carbon nanotubes that are oriented in a direction parallel to a direction in which electric current flows through the carbon nanotube yarn and orthogonal to a direction in which heat transfers from the heat reception part to the heat dissipation part.

5. The thermoelectric conversion module according to claim 1,
    wherein the carbon nanotube yarn is formed as twist yarn in which a plurality of carbon nanotubes in a bundle are twisted at a twist angle of 4° or less.

6. The thermoelectric conversion module according to claim 2, wherein the carbon nanotube yarn is formed as zero twist yarn in which a plurality of carbon nanotubes are oriented in one direction and are gathered.

7. The thermoelectric conversion module according to claim 2,
wherein the carbon nanotube yarn is formed from a plurality of carbon nanotubes that are oriented in a direction parallel to a direction in which electric current flows through the carbon nanotube yarn and orthogonal to a direction in which heat transfers from the heat reception part to the heat dissipation part.

8. The thermoelectric conversion module according to claim 2,
wherein the carbon nanotube yarn is formed as twist yarn in which a plurality of carbon nanotubes in a bundle are twisted at a twist angle of 4° or less.

9. A structure for a thermoelectric conversion element that has a heat reception part and a heat dissipation part, and uses a temperature difference between the heat reception part and the heat dissipation part to generate power, comprising
carbon nanotube yarn that is formed in a fibrous shape from a carbon nanotube and is helically wound around a base material having heat insulation properties, wherein the carbon nanotube yarn includes a plurality of P-type parts formed as P-type semiconductors and a plurality of N-type parts formed as N-type semiconductors, the P-type parts and the N-type parts are alternately arranged and are series-connected in an extension direction of the carbon nanotube yarn, one side part of a helix formed by the carbon nanotube yarn is formed as the heat reception part, and the other side part across the base material from the one side part is formed as the heat dissipation part, lengths of the P-type parts and lengths of the N-type parts are shorter than a length of a one-turn portion of the helix, in the extension direction of the carbon nanotube yarn, and the P-type parts and the N-type parts are arranged such that respective one end parts are included in the heat reception part and respective other end parts are included in the heat dissipation part.

* * * * *